United States Patent
Zhou et al.

(10) Patent No.: US 9,357,678 B2
(45) Date of Patent: May 31, 2016

(54) SEMICONDUCTOR MODULE

(71) Applicants: Leijie Zhou, Tokyo (JP); Hiroyuki Okabe, Tokyo (JP)

(72) Inventors: Leijie Zhou, Tokyo (JP); Hiroyuki Okabe, Tokyo (JP)

(73) Assignee: MITSUBISHI ELECTRIC CORPORATION, Tokyo (JP)

( * ) Notice: Subject to any disclaimer, the term of this patent is extended or adjusted under 35 U.S.C. 154(b) by 225 days.

(21) Appl. No.: 13/784,733

(22) Filed: Mar. 4, 2013

(65) Prior Publication Data

US 2013/0342999 A1 Dec. 26, 2013

(30) Foreign Application Priority Data

Jun. 25, 2012 (JP) ................... 2012-141616

(51) Int. Cl.
H05K 7/20 (2006.01)
H01L 23/40 (2006.01)
H01L 23/049 (2006.01)
H01L 25/07 (2006.01)

(52) U.S. Cl.
CPC .......... H05K 7/20509 (2013.01); H01L 23/049 (2013.01); H01L 23/40 (2013.01); H01L 25/072 (2013.01); H01L 2224/45124 (2013.01); H01L 2224/48091 (2013.01); H01L 2224/48137 (2013.01); H01L 2224/48227 (2013.01); H01L 2924/1305 (2013.01); H01L 2924/13055 (2013.01)

(58) Field of Classification Search
USPC .......................................... 361/715, 710, 704
See application file for complete search history.

(56) References Cited

U.S. PATENT DOCUMENTS

| 7,369,411 | B2 | 5/2008 | Hill et al. |
| 7,486,516 | B2 * | 2/2009 | Colbert et al. ................ 361/710 |
| 7,777,329 | B2 | 8/2010 | Colbert et al. |
| 2005/0073816 | A1 | 4/2005 | Hill et al. |
| 2007/0085197 | A1 | 4/2007 | Arai et al. |
| 2007/0097622 | A1 | 5/2007 | Leech et al. |
| 2007/0097648 | A1 | 5/2007 | Xu et al. |

FOREIGN PATENT DOCUMENTS

| CN | 101484991 A | 7/2009 | |
| GB | 2403070 A | 12/2004 | |
| JP | 2003-168772 A | 6/2003 | |
| JP | 2005-136133 A | 5/2005 | |
| JP | 2006-332479 A | 12/2006 | |
| JP | 2008-004745 A | 1/2008 | |
| JP | 20084745 * | 1/2008 | ............. H01L 23/36 |
| TW | 1316170 B | 10/2009 | |

OTHER PUBLICATIONS

An Office Action issued by the German Patent Office on Nov. 3, 2014, which corresponds to German Patent Application No. 10 2013 207 552.9 and is related to U.S. Appl. No. 13/784,733; with English language translation.

An Office Action issued by the Chinese Patent Office on Sep. 25, 2015, which corresponds to Chinese Patent Application No. 201310056639.7 and is related to U.S. Appl. No. 13/784,733; with English language.

* cited by examiner

Primary Examiner — Andargie M Aychillhum
(74) Attorney, Agent, or Firm — Studebaker & Brackett PC

(57) ABSTRACT

A semiconductor module can be attached to a heat sink. The semiconductor module includes a case housing a component of the semiconductor module, and an elastic member having one end engaging with the case and an opposite end in abutting contact with the heat sink. The elastic member forms a gap between the case and the heat sink, and heat conductive grease is appliable to the gap to be interposed between the case and the heat sink.

10 Claims, 4 Drawing Sheets

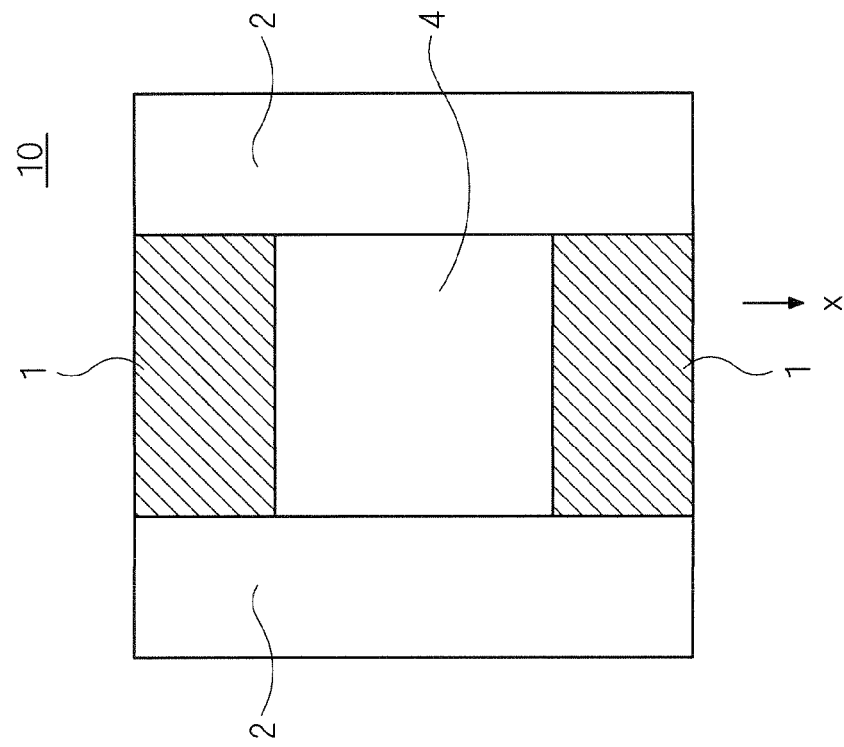
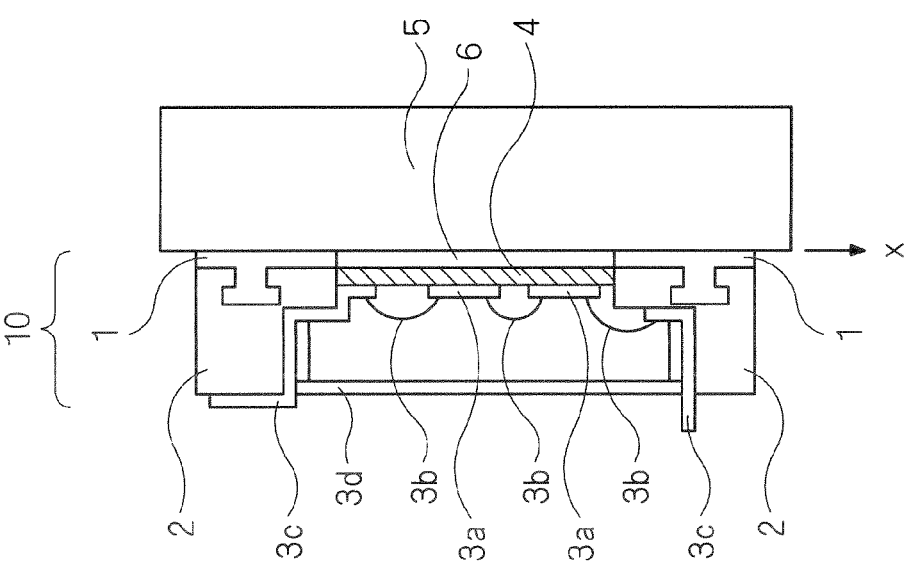
FIG. 1A
FIG. 1B

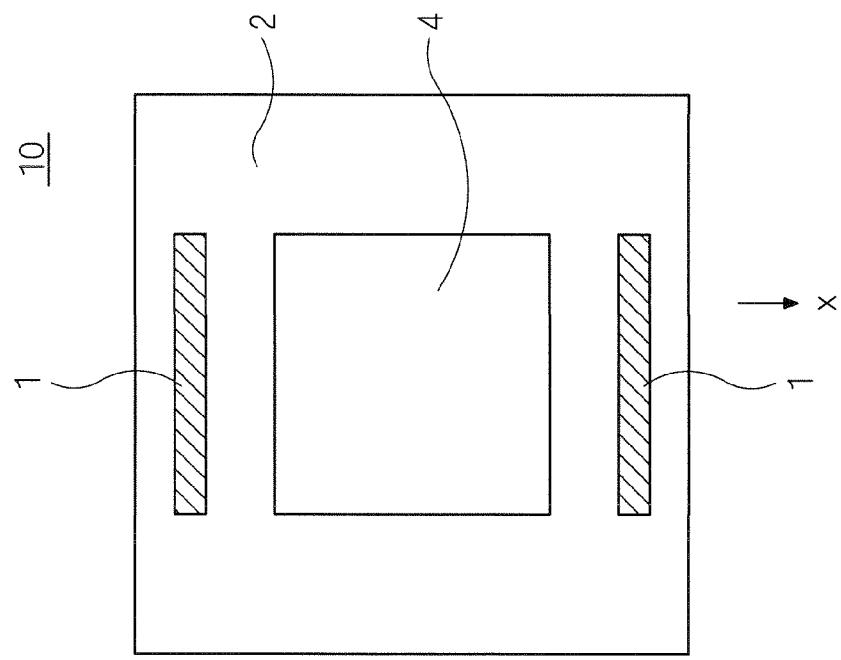
F I G. 2A
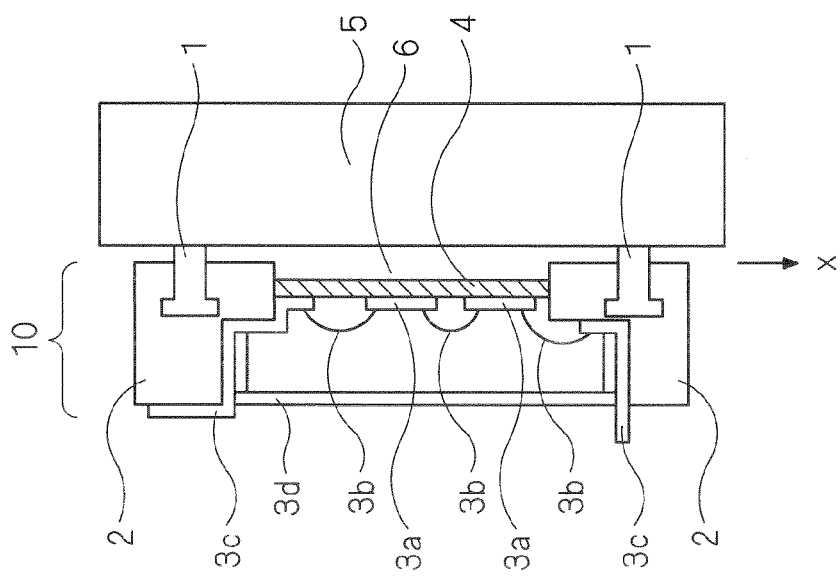
F I G. 2B

F I G . 4
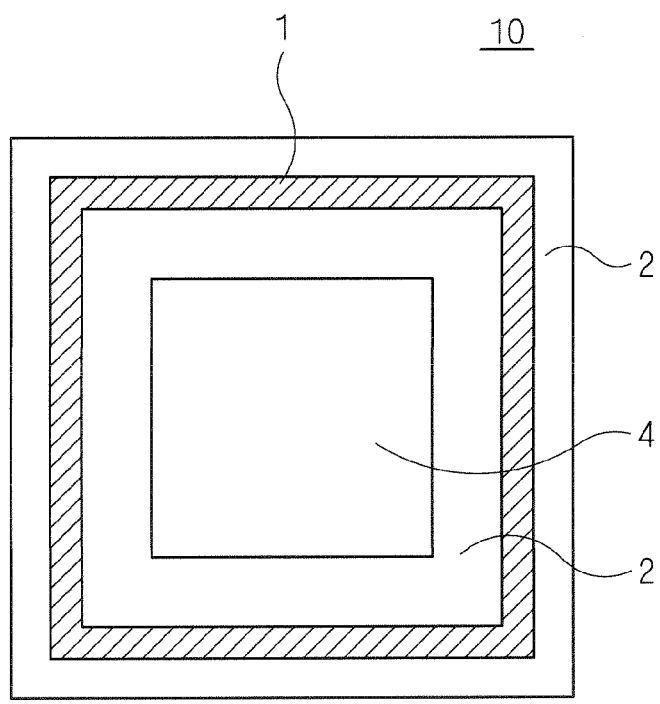

SEMICONDUCTOR MODULE

BACKGROUND OF THE INVENTION

1. Field of the Invention

The present invention relates to a semiconductor module, and more specifically, to a semiconductor module that can be attached to a heat sink.

2. Background Art

Regarding use of a semiconductor module, more specifically, a semiconductor module handling a great deal of electric power, the semiconductor device is generally attached to a heat sink for dissipation of heat generated while the semiconductor device is in operation. In order to transfer heat of the semiconductor module efficiently to the heat sink, heat conductive grease is applied between the semiconductor module and the heat sink (see Japanese Patent Application Laid-Open No. 2008-4745, for example).

Conventionally, an elastic member is arranged on the bottom surface of the semiconductor module by adhesive bonding. The semiconductor module is attached to the heat sink by adhesively bonding the elastic member and the heat sink with an adhesive.

The elastic member is arranged to surround heat conductive grease interposed between the semiconductor module and the heat sink, so that the elastic member also functions to prevent leakage of the heat conductive grease.

In the aforementioned conventional technique, the elastic member is adhesively bonded with an adhesive to the bottom surface of the semiconductor module and the heat sink. Thus, if adhesively bonded part is deteriorated by the influence of heat generation in the semiconductor module, for example, the heat conductive grease flows out from the deteriorated part. In this case, heat of the semiconductor module is not dissipated appropriately, leading to reduction of the performance of the semiconductor module.

If the adhesively bonded part is deteriorated further, the semiconductor module may fall off the heat sink.

The aforementioned problems are likely to occur, especially if the semiconductor module is attached at an angle not horizontal to the ground.

SUMMARY OF THE INVENTION

It is an object of the present invention to provide a semiconductor module capable of suppressing leakage of heat conductive grease interposed between the semiconductor module and a heat sink.

A semiconductor module of the present invention can be attached to a heat sink. The semiconductor module includes a case housing a component of the semiconductor module, and an elastic member having one end engaging with the case and an opposite end in abutting contact with the heat sink. In the semiconductor module of the present invention, the elastic member forms a gap between the case and the heat sink, and heat conductive grease is appliable to the gap to be interposed between the case and the heat sink.

According to the present invention, the elastic member engages with the case and is fixed to the case. Thus, the elastic member does not come off the case. This suppresses leakage of the heat conductive grease applied to the gap between the case and the heat sink to be interposed therebetween. Additionally, as the elastic member does not come off the case, the semiconductor module itself does not fall off. As a result, the semiconductor module can be used for a long time.

These and other objects, features, aspects and advantages of the present invention will become more apparent from the following detailed description of the present invention when taken in conjunction with the accompanying drawings.

BRIEF DESCRIPTION OF THE DRAWINGS

FIGS. 1A and 1B are sectional and bottom views respectively of a semiconductor module of a first preferred embodiment;

FIGS. 2A and 2B are sectional and bottom views respectively of a semiconductor module of a second preferred embodiment;

FIG. 4 is a bottom view of a semiconductor module of a fourth preferred embodiment.

EMBODIMENT FOR CARRYING OUT THE INVENTION

First Preferred Embodiment

Structure

Figure 3A:
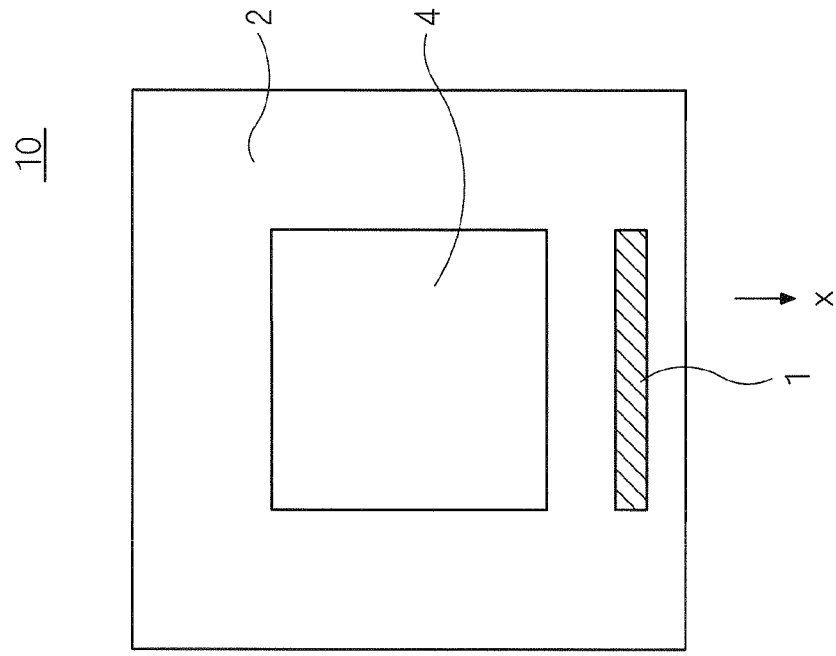
FIGS. 3A and 3B are sectional and bottom views respectively of a semiconductor module of a third preferred embodiment.

FIGS. 1A and 1B are sectional and bottom views respectively of a semiconductor module 10 of a first preferred embodiment. Regarding use of the semiconductor module 10 of the first preferred embodiment, the semiconductor module 10 is attached to a heat sink 5 as shown in FIG. 1A. Heat conductive grease is applied to a gap 6 between the semiconductor module 10 and the heat sink 5 to be interposed therebetween.

The description of the first preferred embodiment is based on the condition that the semiconductor module 10 is attached at an angle not horizontal to the ground, for example, at an angle vertical to the ground. In FIGS. 1A and 1B, a direction x indicates a downward direction.

The semiconductor module 10 is configured as follows. Semiconductor elements 3a such as IGBTs (insulated gate bipolar transistors) and freewheeling diodes are arranged above a metal substrate 4 through an insulating substrate (not shown in the drawings). Electrodes of each of the semiconductor elements 3a and a main electrode 3c are connected through interconnect lines such as aluminum wires 3b. These components of the semiconductor module 10 are housed in a case 2. A cover 3d is attached to upper part of the case 2 to hermetically seal the case 2.

Elastic members 1 are arranged on the bottom surface of the case 2. One end of each of the elastic members 1 engages with the bottom surface of the case 2, and the engaging part has an H shape. The opposite end of each of the elastic members 1 makes abutting contact with the heat sink 5.

As shown in FIG. 1B, the elastic members 1 are arranged to extend along a side of the bottom surface of the case 2 nearest the downward direction, and along a side opposite the side nearest the downward direction. In particular, arranging the elastic member 1 so as to extend along the side of the bottom surface of the case 2 nearest the downward direction allows suppression of leakage of the heat conductive grease to occur by gravitation.

The elastic members 1 are made of a rubber resin, for example. The heat sink 5 is made of a material such as aluminum and copper. For efficient heat dissipation, the heat sink 5 may be provided with a fin.

For fixation of the semiconductor module 10 to the heat sink 5, the opposite ends of the elastic members 1 and the heat sink 5 are adhesively bonded through an adhesive to fix the semiconductor module 10. Or, the case 2 and the heat sink 5 are fastened with a screw to make the elastic members 1 contact the heat sink 5 under pressure, thereby fixing the semiconductor module 10. In this case, the case 2 and the heat sink 5 are fastened with a screw easily as the elastic members 1 engage with the case 2 in advance.

Fixing the case 2 to the heat sink 5 through the elastic members 1 forms the gap 6 between the semiconductor module 10 and the heat sink 5. In order to transfer heat generated in the semiconductor module 10 efficiently to the heat sink 5, the heat conductive grease is applied to the gap 6 to be interposed between the case 2 and the heat sink 5. The heat conductive grease mentioned here is generally used grease, and mainly contains silicon, for example.

<Effects>

The semiconductor module 10 of the first preferred embodiment can be attached to the heat sink 5. The semiconductor module 10 includes the case 2 housing the components of the semiconductor module 10, and the elastic members 1 each having one end engaging with the case 2 and an opposite end in abutting contact with the heat sink 5. The elastic members 1 form the gap 6 to which the grease is appliable to be interposed between the case 2 and the heat sink 5.

The elastic members 1 engage with the case 2 and are fixed to the case 2. Thus, the elastic members 1 do not come off the case 2. This suppresses leakage of the heat conductive grease applied to the gap 6 between the case 2 and the heat sink 5 to be interposed therebetween. Additionally, as the elastic members 1 do not come off the case 2, the semiconductor module 10 itself does not fall off. As a result, the semiconductor module 10 can be used for a long time.

The elastic members 1 provided in the semiconductor module 10 of the first preferred embodiment have H-shaped parts engaging with the case 2.

Forming the engaging parts of the elastic members 1 into an H shape allows the elastic members 1 to be fixed reliably to the case 2. Forming the engaging parts into an H shape also allows the elastic members 1 to make abutting contact with the heat sink 5 in an wider area. Thus, the elastic members 1 and the heat sink 5 can be adhesively bonded to each other or can contact each other under pressure more reliably during attachment of the semiconductor module 10 to the heat sink 5. This allows suppression of leakage of the heat conductive grease from the gap 6 between the case 2 and the heat sink 5.

Second Preferred Embodiment

FIGS. 2A and 2B are sectional and bottom views respectively of a semiconductor module 10 of a second preferred embodiment. In the semiconductor module 10 of the second preferred embodiment, engaging parts of elastic members 1 have a T shape. The structure of the second preferred embodiment is the same in other respects as that of the first preferred embodiment (FIGS. 1A and 1B), so that it will not be described again. Like in FIGS. 1A and 1B, a direction x of FIGS. 2A and 2B indicates a downward direction.

<Effects>

The elastic members 1 provided in the semiconductor module 10 of the second preferred embodiment have T-shaped parts engaging with a case 2.

Thus, like in the first preferred embodiment, suppression of leakage of heat conductive grease from connection parts between the case 2 and the elastic members 1 can be suppressed. Further, the elastic members 1 do not come off the case 2, so that the semiconductor module 10 itself does not fall off a heat sink.

Additionally, forming the engaging parts of the elastic members 1 into a T shape allows size reduction of the elastic members 1, compared to those of the first preferred embodiment. This allows the amount of material used for the elastic members 1, thereby allowing reduction of manufacturing cost.

Third Preferred Embodiment

Figure 3B:
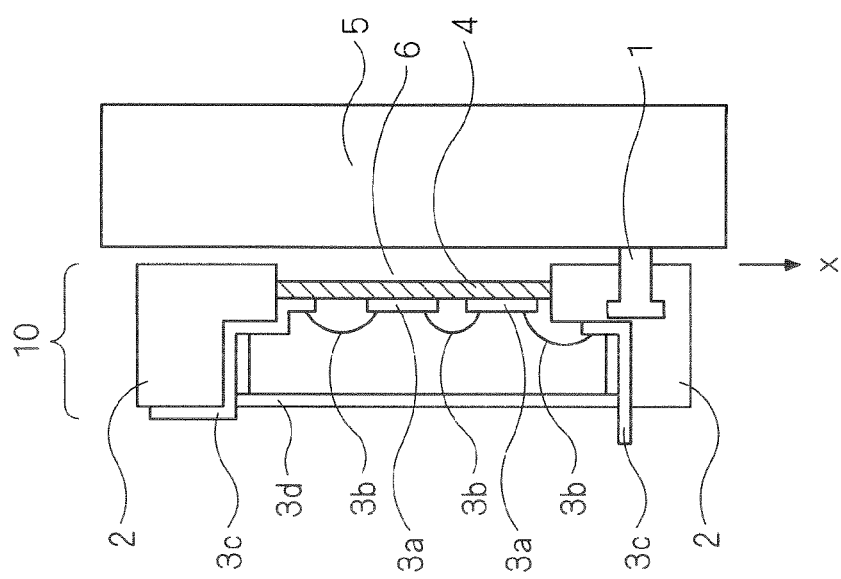

FIGS. 3A and 3B are sectional and bottom views respectively of a semiconductor module 10 of a third preferred embodiment. A direction x of FIGS. 3A and 3B indicates a downward direction.

As shown in FIG. 3B, in the semiconductor module 10 of the third preferred embodiment, an elastic member 1 is arranged to extend along only a side of the bottom surface of a case 2 nearest the x direction. The structure of the third preferred embodiment is the same in other respects as that of the second preferred embodiment (FIGS. 2A and 2B), so that it will not be described again.

The elastic member 1 is arranged to extend along at least the side nearest the downward direction, namely, the x direction. So, even if heat conductive grease applied to a gap 6 between the semiconductor module 10 and a heat sink 5 to be interposed therebetween is caused to flow in the downward direction by gravitation, this arrangement of the elastic member 1 works effectively in preventing leakage of the heat conductive grease. Additionally, the semiconductor module 10 can be fixed to the heat sink 5 by the elastic member 1.

<Effects>

The elastic member 1 provided in the semiconductor module 10 of the third preferred embodiment is arranged to extend along only one side of the case 2.

Arranging the elastic member 1 to extend along only the side of the case 2 nearest the downward direction allows further reduction of the amount of material used for the elastic member 1 to allow further reduction of manufacturing cost, while achieving the same effect as that of the second preferred embodiment.

Fourth Preferred Embodiment

FIG. 4 is a bottom view of a semiconductor module 10 of a fourth preferred embodiment. The sectional view thereof is the same as that of the second preferred embodiment (FIG. 2A). As shown in FIG. 4, an elastic member 1 provided in the semiconductor module 10 of the fourth preferred embodiment is arranged to extend along the outer edge of the bottom surface of a case 2. The structure of the fourth preferred embodiment is the same in other respects as that of the second preferred embodiment, so that it will not be described again.

<Effects>

The elastic member 1 provided in the semiconductor module 10 of the fourth preferred embodiment is arranged to extend along the outer edge of the case 2.

Thus, when the semiconductor module 10 is attached to a heat sink 5, heat conductive grease applied to a gap 6 between the semiconductor module 10 and the heat sink 5 to be interposed therebetween is surrounded by the elastic member 1. As a result, the semiconductor module 10 of the fourth preferred embodiment is capable of preventing leakage of the heat conductive grease more reliably.

The preferred embodiments of the present invention can be combined freely, and each of the preferred embodiments can be modified or omitted where appropriate without departing from the scope of the invention.

While the invention has been shown and described in detail, the foregoing description is in all aspects illustrative and not restrictive. It is therefore understood that numerous modifications and variations can be devised without departing from the scope of the invention.

What is claimed is:

1. A semiconductor module that can be attached to a heat sink, the semiconductor module comprising
   a case housing a component of said semiconductor module, and
   an elastic member having one end embedded in a bottom surface of said case and an opposite end in abutting contact with a main plane of said heat sink,
   said elastic member forming a gap between said case and said heat sink, heat conductive grease being applied into the gap to be interposed between said case and said heat sink.

2. The semiconductor module according to claim 1, wherein said one end of said elastic member has an H shape.

3. The semiconductor module according to claim 2, wherein said elastic member is arranged to extend along only one side of said case.

4. The semiconductor module according to claim 2, wherein said elastic member is arranged to extend along an outer edge of said case.

5. The semiconductor module according to claim 1, wherein said one end of said elastic member has a T shape.

6. The semiconductor module according to claim 5, wherein said elastic member is arranged to extend along only one side of said case.

7. The semiconductor module according to claim 5, wherein said elastic member is arranged to extend along an outer edge of said case.

8. The semiconductor module according to claim 1, wherein said elastic member is arranged to extend along only one side of said case.

9. The semiconductor module according to claim 1, wherein said elastic member is arranged to extend along an outer edge of said case.

10. The semiconductor module according to claim 1, wherein said heat conductive grease is applied into the gap to be interposed between said case and said heat sink so as to make direct contact with both said case and said heat sink.

* * * * *